United States Patent
Ogawa et al.

(10) Patent No.: US 7,968,360 B2
(45) Date of Patent: *Jun. 28, 2011

(54) METHOD OF PRODUCING NITRIDE SEMICONDUCTOR LIGHT-EMITTING DEVICE USING A SURFACTANT MATERIAL

(75) Inventors: Atsushi Ogawa, Higashihiroshima (JP); Satoshi Komada, Mihara (JP); Hiroki Takaoka, Nara (JP); Hiroshi Nakatsu, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 64 days.

This patent is subject to a terminal disclaimer.

(21) Appl. No.: 12/213,229

(22) Filed: Jun. 17, 2008

(65) Prior Publication Data
US 2008/0311695 A1 Dec. 18, 2008

(30) Foreign Application Priority Data
Jun. 18, 2007 (JP) ................................. 2007-160285

(51) Int. Cl.
*H01L 21/00* (2006.01)
(52) U.S. Cl. .......... 438/46; 438/483; 438/681; 257/103; 257/E33.023
(58) Field of Classification Search .................. None
See application file for complete search history.

(56) References Cited

U.S. PATENT DOCUMENTS

| | | | |
|---|---|---|---|
| 4,855,249 A * | 8/1989 | Akasaki et al. | 117/95 |
| 6,172,382 B1 | 1/2001 | Nagahama et al. | |
| 6,677,619 B1 | 1/2004 | Nagahama et al. | |
| 6,876,686 B2 * | 4/2005 | Tandon et al. | 372/44.01 |
| 7,589,346 B2 * | 9/2009 | Biwa et al. | 257/13 |
| 7,601,985 B2 * | 10/2009 | Kinoshita et al. | 257/76 |
| 7,807,491 B2 * | 10/2010 | Komada et al. | 438/46 |
| 2001/0028063 A1 | 10/2001 | Koike et al. | |
| 2002/0195606 A1 * | 12/2002 | Edmond et al. | 257/79 |
| 2005/0211995 A1 * | 9/2005 | Ou et al. | 257/80 |
| 2006/0175600 A1 * | 8/2006 | Sato et al. | 257/14 |
| 2006/0189012 A1 * | 8/2006 | Ueta et al. | 438/21 |
| 2008/0113496 A1 * | 5/2008 | Keller et al. | 438/481 |

FOREIGN PATENT DOCUMENTS
| JP | 10-335757 | 12/1998 |
|---|---|---|
| JP | 11-177175 | 7/1999 |
| JP | 2001-168385 | 6/2001 |

* cited by examiner

*Primary Examiner* — Marcos D Pizarro
*Assistant Examiner* — Andres Muñoz
(74) *Attorney, Agent, or Firm* — Harness, Dickey & Pierce, P.L.C.

(57) ABSTRACT

In a method of producing a nitride semiconductor light-emitting device including a nitride semiconductor active layer (105) held between an n-type nitride semiconductor layer (103, 104) and a p-type nitride semiconductor layer (106 to 108) on a substrate (101), at least any one of the n-type layer, the active layer and the p-type layer includes a multilayer film structure, and a surfactant material is supplied to a crystal growth surface just before, during or after crystal growth of a layer included in the multilayer film structure.

19 Claims, 4 Drawing Sheets ically to a production method that can improve crystal
METHOD OF PRODUCING NITRIDE SEMICONDUCTOR LIGHT-EMITTING DEVICE USING A SURFACTANT MATERIAL This nonprovisional application is based on Japanese Patent Application No. 2007-160285 filed on Jun. 18, 2007 with the Japan Patent Office, the entire contents of which are hereby incorporated by reference.

BACKGROUND OF THE INVENTION

1. Field of the Invention

The present invention relates to a method of producing a nitride semiconductor light-emitting device and more particularly to a production method that can improve crystal quality of the active layer included in the light-emitting device and then light-emitting efficiency of the device.

2. Description of the Background Art

In the light-emitting device, it is important to reduce crystal defects such as dislocations in the active layer for causing light emission, in order to improve the light-emitting efficiency (refer to Japanese Patent Laying-Open Nos. 10-335757, 11-177175 and 2001-168385, for example).

In order to suppress formation of such crystal defects, in the case that a layer, such as a clad layer of a high Al concentration, having a composition different from that of quantum well layers included in an active layer of a nitride semiconductor light-emitting device is placed in proximity to the active layer, it is proposed to introduce into the clad layer a multilayer film structure varying in Al concentration.

Furthermore, in order to relax strain caused by difference between lattice constants of an n-type or p-type GaN layer and the well layers, it is also proposed to introduce into the n-type or p-type GaN layer a multilayer film structure having its In concentration gradually increased in approaching the active layer.

In the multilayer film structure, however, layers in contact with each other have compositions different from each other and crystal growth surfaces of these layers have different surface energy levels, and hence it is difficult to steeply (definitely) form the interface between the layers in the multilayer film structure.

If the layer interface in the multilayer film structure is not definite, dislocations may be generated from the layer interface, or the interface between the well layers in the active layer formed on the multilayer film structure may not be made definite.

The thickness of well layers including dislocations or loose interfaces is spatially irregular. In general, the internal quantum efficiency remarkably depends on the thickness of the well layers. In the case that the thickness of the well layers is irregular, therefore, portions having low internal quantum efficiency are dispersed in the well layers, and the internal quantum efficiency of the overall well layers is reduced. The internal quantum efficiency denotes the efficiency for forming photons due to recombination of electrons and holes which are charge carriers generated by electric current injected into the light-emitting device from the outside.

SUMMARY OF THE INVENTION

In consideration of the aforementioned circumstances in the prior art, an object of the present invention is to provide a method of producing a nitride semiconductor light-emitting device including a multilayer film structure, with which it is possible to improve internal quantum efficiency of the light-emitting device.

The present invention provides a method of producing a nitride semiconductor light-emitting device including a nitride semiconductor active layer held between an n-type nitride semiconductor layer and a p-type nitride semiconductor layer on a substrate, wherein at least any one of the n-type layer, the active layer and the p-type layer includes a multilayer film structure, and a surfactant material is supplied to a crystal growth surface just before, during or after crystal growth of a layer included in the multilayer film structure. The surfactant material preferably contains at least one of In, Al, Ga, Mg, Zn, Si, Ge and O.

The multilayer film structure can include at least two types of layers having different band gaps. In this case, the surfactant material is preferably introduced before or during growing a layer having a larger band gap as compared with another layer just under that layer.

The multilayer film structure can also include at least two types of layers having different carrier concentrations. In this case, the surfactant material is preferably introduced before growing a layer having a smaller carrier concentration as compared with another layer just under that layer.

When an element other than group III elements is introduced as the surfactant material, supply of a source material containing a group III element is preferably stopped. When a group III element is introduced as the surfactant material, on the other hand, supply of a source material containing nitrogen is preferably stopped. Metal organic vapor phase growth can be preferably utilized for the crystal growth.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
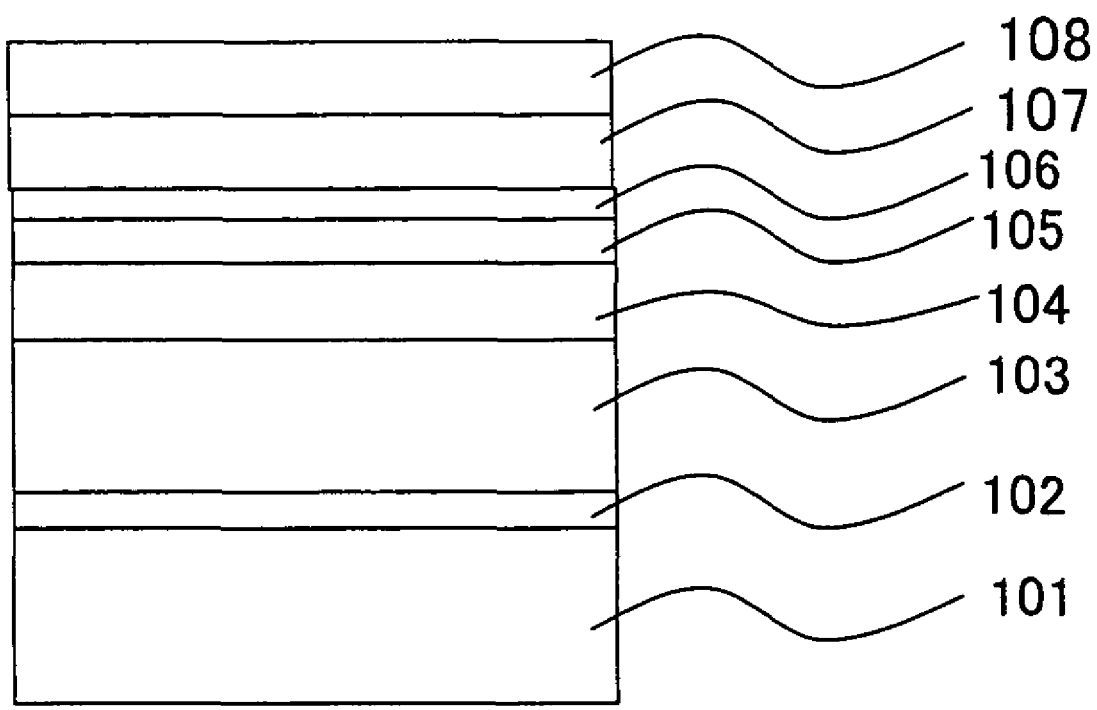
FIG. 1 is a schematic sectional view showing a multilayer semiconductor structure included in a nitride semiconductor light-emitting diode according to an embodiment of the present invention.

As hereinabove described, the present invention provides a method of producing a nitride semiconductor light-emitting device including a nitride semiconductor active layer held between an n-type nitride semiconductor layer and a p-type nitride semiconductor layer on a substrate, wherein at least any one of the n-type layer, the active layer and the p-type layer includes a multilayer film structure, and a surfactant material is supplied to a crystal growth surface just before, during or after crystal growth of a layer included in the multilayer film structure.

Thus, even in the case that a layer interface in the multilayer film structure is not made definite by the usual crystal growth, the layer interface in the multilayer film structure can be made definite by supplying the surfactant to the crystal growth surface and controlling the surface energy. It is therefore possible to ensure interface flatness and interface definiteness for the active layer formed in proximity to the n-type or p-type layer including the multilayer film structure or for the active layer having its multilayer film structure. Consequently, it is possible to improve the internal quantum efficiency of the overall active layer by remedying irregularity of the internal quantum efficiency in the active layer.

In the case of crystal-growing the multilayer film structure in the nitride-based semiconductor light-emitting device, the surfactant material preferably contains at least one of In, Al, Ga, Mg, Zn, Si, Ge and O.

The surfactant material must have a property causing a two-dimensional crystal growth mode (FM (Frank-van der Merwe) mode). Not island-like or uneven crystal growth but two-dimensionally homogeneous layered crystal growth occurs in the FM mode. The surfactant material causing the FM mode is desirably a substance having low surface energy, specifically smaller than general surface energy (about 2.0 $J/m^2$) of GaN mainly constituting the nitride semiconductor light-emitting device. Each of the aforementioned In, Al, Ga, Mg, Zn, Si, Ge and O has lower surface energy than GaN.

While the surfactant material generally tends to be in a sate of a thin atomic layer floating over the crystal growth surface, the atoms in the atomic layer are partially incorporated into the crystal. Therefore, the surfactant material is preferably one of group III elements, an n-type impurity element or a p-type impurity element that are generally used for producing a nitride semiconductor device. Among the aforementioned surfactant materials, Al, Ga and In are group III elements; Si, Ge and O correspond to n-type impurity elements; and Zn and Mg correspond to p-type impurity elements.

The multilayer film structure included in the n-type layer, the active layer or the p-type layer can be formed with combination of at least two types of layers having different band gaps. Thus, it is possible to select a multilayer film structure capable of suppressing lattice strain caused in the active layer, and it is also possible to clearly define the layer interface through use of the surfactant in crystal growth of the multilayer film structure. Consequently, the interface flatness and interface definiteness can be ensured for the active layer formed in proximity to the multilayer film structure or for the active layer having its multilayer film structure, and thus the internal quantum efficiency of the overall active layer can be improved by reducing irregularity of the internal quantum efficiency in the active layer.

In the case that the multilayer film structure is formed by combination of at least two types of layers having different band gaps, the surfactant is preferably introduced before or during growing a layer having a larger band gap as compared with another layer just under that layer. The reason for this is as follows:

A nitride semiconductor having a large band gap tends to have high surface energy. In the case that a nitride semiconductor layer having a larger band gap is grown on a nitride semiconductor layer having a smaller band gap, therefore, it follows that a layer having higher surface energy is grown on a layer having lower surface energy, and the layer of higher surface energy tends to crystal-grow easily in an island-like or uneven manner. As a countermeasure to this tendency, if the surfactant is introduced before growing a layer having a larger band gap as compared with another layer under that layer, it is possible to flatten the crystal growth surface of the layer having the larger band gap, and it is also possible to clearly define the layer interface in the multilayer film structure.

The multilayer film structure included in the n-type or p-type layer may alternatively be formed with combination of at least two types of layers having different carrier concentrations. In this case, carriers can easily spread in the layer of higher carrier concentration having a lower resistance, and this enhances spreading of carriers in the active layer placed in proximity to the multilayer film structure, thereby improving the internal quantum efficiency of the active layer. By using the surfactant in crystal growth of the multilayer film structure so as to flatten the layer interface, it also becomes possible to ensure flatness and definiteness of the active layer proximate to the multilayer film structure, thereby further improving the internal quantum efficiency.

When the multilayer film structure is formed by combination of at least two types of layers having different carrier concentrations, the surfactant is preferably introduced before start of crystal growth for a layer having a smaller carrier concentration as compared with another layer under that layer. This is because, in crystal growth for the layer of lower carrier concentration, the low-concentration dopant exerts only small influence on the surfactant and hence it is considered that the surfactant easily exhibits the effects thereof.

When an element other than group III elements is introduced as the surfactant material in crystal growth of the multilayer film structure, supply of a source material of the group III element is preferably stopped so as to temporarily stop the crystal growth. Then, the atomic layer of the surfactant sufficiently spreads over the crystal growth surface, and the effect of reducing the surface energy can be ensured. If a group III element is introduced as the surfactant material, on the other hand, supply of a source material of nitrogen is preferably stopped so as to temporarily stop the crystal growth. In this case also, the atomic layer of the surfactant sufficiently spreads over the crystal growth surface, and the effect of reducing the surface energy can be ensured. As a matter of course, a metal organic vapor phase growth method can preferably be employed as the crystal growth method for various nitride semiconductor layers in the present invention.

An embodiment of the present invention is now described with reference to the drawings. In the accompanying drawings, dimensional relations between thickness, width and the like of layers are arbitrarily changed in order to clarify and simplify the illustrations, and thus do not correspond to the actual dimensional relations. In the accompanying drawings, the identical reference numbers denote the same or corresponding portions.

(Production of Light-Emitting Diode)

FIG. 1 is a schematic sectional view showing a multilayer semiconductor structure included in a nitride semiconductor light-emitting diode to be produced as an embodiment of the present invention. In order to form this multilayer semiconductor structure, a buffer layer 102, an n-type nitride semiconductor layer 103, an n-side multilayer film structure 104, an active layer 105, an evaporation-prevention layer 106, a p-side multilayer film structure 107, and a p-type nitride semiconductor layer 108 are successively stacked on a sapphire substrate 101 for crystal growth.

Substrate 101 for crystal growth may alternatively be prepared from SiC, Si or ZnO in place of sapphire. Buffer layer 102 can preferably be formed of GaN or may be formed of AlN or $Al_xIn_yGa_{1-x-y}N$ ($0 \leq x \leq 1$, $0 \leq y \leq 1$).

(Active Layer)

Active layer 105 can include quantum well layers and barrier layers as the multilayer film structure thereof, and can include six well layers, for example. The well layers and the barrier layers are alternately stacked, as a matter of course. The well layers can be formed of $In_{0.15}Ga_{0.85}N$, and the barrier layers can be formed of $Al_{0.01}In_{0.02}Ga_{0.97}N$, for example. Alternatively, the well layers can be formed of In$_a$Ga$_{1-a}$N (0<a<1), and the barrier layers can be formed of Al$_b$In$_c$Ga$_{1-b-c}$N (0≦b≦1, 0≦c≦1).

(n-Side and p-Side Multilayer Film Structures)

Figure 2:
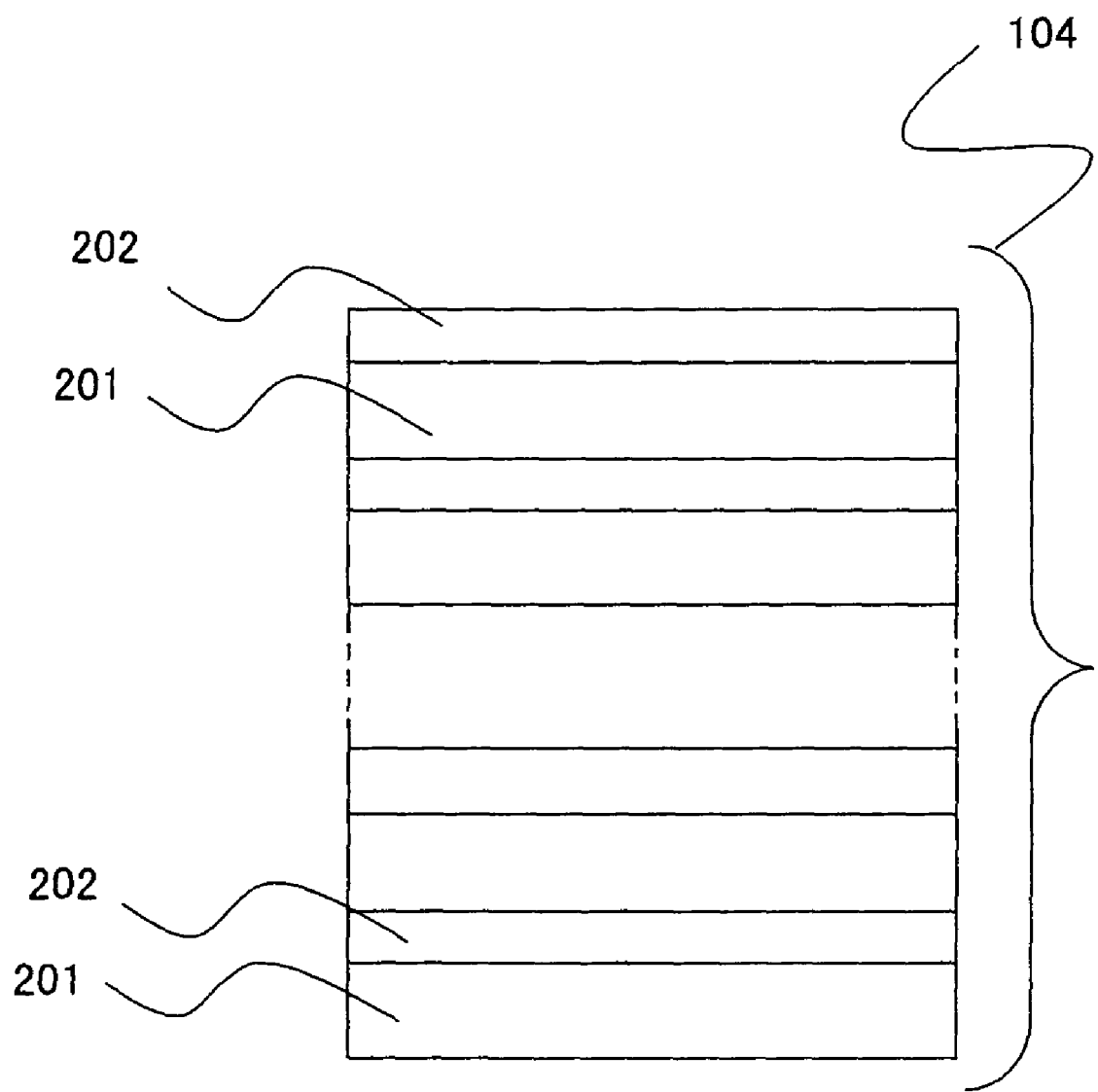
FIG. 2 is a schematic sectional view of an n-side multilayer film structure included in the multilayer semiconductor structure of FIG. 1.
Figure 3:
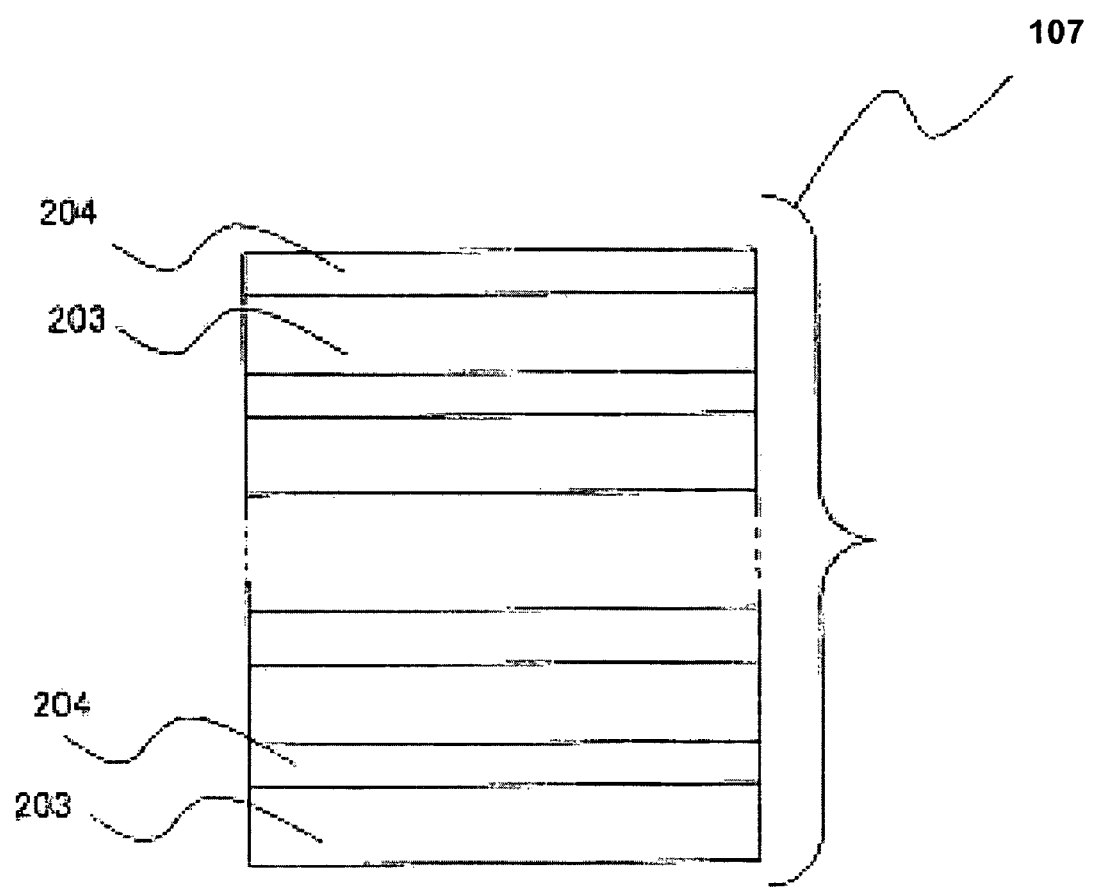
FIG. 3 is a schematic sectional view of a p-side multilayer film structure included in the multilayer semiconductor structure of FIG. 1.

FIGS. 2 and 3 are schematic sectional views showing n-side multilayer film structure 104 and p-side multilayer film structure 107, respectively. More specifically, n-side multilayer film structure 104 is formed by alternately and repetitively stacking n-type Al$_{0.2}$Ga$_{0.8}$N layers 201 and undoped GaN layers 202, and p-side multilayer film structure 107 is formed by alternately and repetitively stacking p-type Al$_{0.2}$Ga$_{0.8}$N layers 203 and undoped GaN layers 204.

However, the n-side and p-side multilayer film structures are not restricted to those shown in FIGS. 2 and 3, but each multilayer film structure can be constituted of combination of at least two types of layers having different composition ratios of Al, In, Ga, etc. and/or different dopant concentrations.

(Crystal Growth)

First, sapphire substrate 101 is set in a reaction furnace of an MOCVD (metal organic chemical vapor deposition) apparatus. The temperature of sapphire substrate 101 is raised to 1050° C. with hydrogen being fed into the reaction furnace, whereby cleaning a main surface (C plane) of sapphire substrate 101.

After the temperature of sapphire substrate 101 is reduced to 510° C., the reaction furnace is supplied with ammonia and TMG (trimethylgallium) for source gas along with hydrogen as carrier gas, so as to deposit GaN buffer layer 102 to a thickness of about 20 nm on the main surface (C plane) of sapphire substrate 101.

After the temperature of sapphire substrate 101 is again raised to 1050° C., the reaction furnace is supplied with ammonia and TMG (trimethylgallium) for source gas, SiH$_4$ (silane) as impurity gas and hydrogen as carrier gas, and thus a GaN underlayer doped with Si is deposited on buffer layer 102 by MOCVD such that it has a thickness of 6 μm and a carrier concentration of 1×10$^{18}$/cm$^3$. Then, similarly as in the case of the n-type GaN underlayer, an n-type GaN contact layer doped with Si is deposited on the n-type GaN underlayer by MOCVD such that it has a thickness of 0.5 μm and a carrier concentration of 5×10$^{18}$/cm$^3$. In this manner, the n-type GaN underlayer and the n-type GaN contact layer thereon are deposited as n-type nitride semiconductor layer 103.

(Growth of n-Side Multilayer Film Structure)

Thereafter, the supply of SiH$_4$, TMG and NH$_3$ is stopped; TMI (trimethylindium) is introduced for 15 seconds after a lapse of 10 seconds so as to cover the crystal growth surface with In serving as the surfactant; and SiH$_4$, TMG, TMA (trimethylaluminum) and NH$_3$ are then introduced to form an Al$_{0.2}$Ga$_{0.8}$N layer 201 having a thickness of 10 nm. Thereafter, TMG and NH$_3$ are introduced to form an undoped GaN layer 202 having a thickness of 10 nm. Similar steps are repeated to form n-side multilayer film structure 104 constituted of repetitively stacked n-type Al$_{0.2}$Ga$_{0.8}$N layers 201 and undoped GaN layers 202.

(Growth of Active Layer)

After the temperature of sapphire substrate 101 is reduced to 700° C., the reaction furnace is supplied with ammonia, TMG and TMI for source gas along with nitrogen as carrier gas, so as to deposit an In$_{0.15}$Ga$_{0.85}$N well layer of 2.5 nm thickness on n-side multilayer film structure 104.

While the temperature of substrate 101 is kept at 700° C., the surfactant is introduced and then the reaction furnace is supplied with ammonia and TMG for source gas along with nitrogen as carrier gas, so as to deposit a GaN barrier layer to a thickness of 18 nm.

The cycle of deposition of the well layer, supply of the surfactant and deposition of the barrier layer is repeated six times to form active layer 105.

(Growth of Evaporation-Prevention Layer)

After the temperature of sapphire substrate 101 is increased to 950° C., the reaction furnace is supplied with ammonia, TMG and TMA for source gas along with Cp$_2$Mg (cyclopentadienylmagnesium) as impurity gas and hydrogen as carrier gas, so as to deposit Al$_{0.15}$Ga$_{0.85}$N evaporation-prevention layer 106 of about 30 nm thickness doped with Mg at a concentration of 1×10$^{20}$/cm$^3$ on active layer 105 by MOCVD. Evaporation-prevention layer 106 is formed in order to prevent active layer 105 from evaporating in the subsequent MOCVD process.

(Growth of p-Side Multilayer Film Structure)

Then, the supply of Cp$_2$Mg, TMG and NH$_3$ is stopped; TMI is introduced for 15 seconds after a lapse of 10 seconds to cover the crystal growth surface with In serving as the surfactant; and thereafter Cp$_2$Mg, TMG, TMA and NH$_3$ are introduced to form a p-type Al$_{0.2}$Ga$_{0.8}$N layer 203 having a thickness of 10 nm. Thereafter, TMG and NH$_3$ are introduced to form an undoped GaN layer 204 having a thickness of 10 nm. Similar steps are repeated to form p-side multilayer film structure 107 constituted of repetitively stacked p-type Al$_{0.2}$Ga$_{0.8}$N layers 203 and undoped GaN layers 204.

The surfactant of In may be introduced at any stage of before, after or during growth of a layer included in the multilayer film structure, to attain the effects thereof. However, it is more preferable to introduce In before growth of each p-type Al$_{0.2}$Ga$_{0.8}$N layer 203 having higher surface energy.

(Growth of p-Type Contact Layer)

While the temperature of sapphire substrate 101 is kept at 950° C., the reaction furnace is supplied with ammonia and TMG for source gas along with Cp$_2$Mg as impurity gas and hydrogen as carrier gas, so as to deposit p-type GaN contact layer 108 of 0.1 μm thickness doped with Mg at a concentration of 1×10$^{20}$/cm$^3$ on p-side multilayer film structure 107 by MOCVD.

Thereafter, the temperature of sapphire substrate 101 is reduced to 700° C., and annealing of the overall wafer including the multilayer semiconductor structure 102 to 108 formed on sapphire substrate 101 is carried out while nitrogen is introduced to form an atmosphere in the reaction furnace.

(Processing into Light-Emitting Diode)

Figure 4:
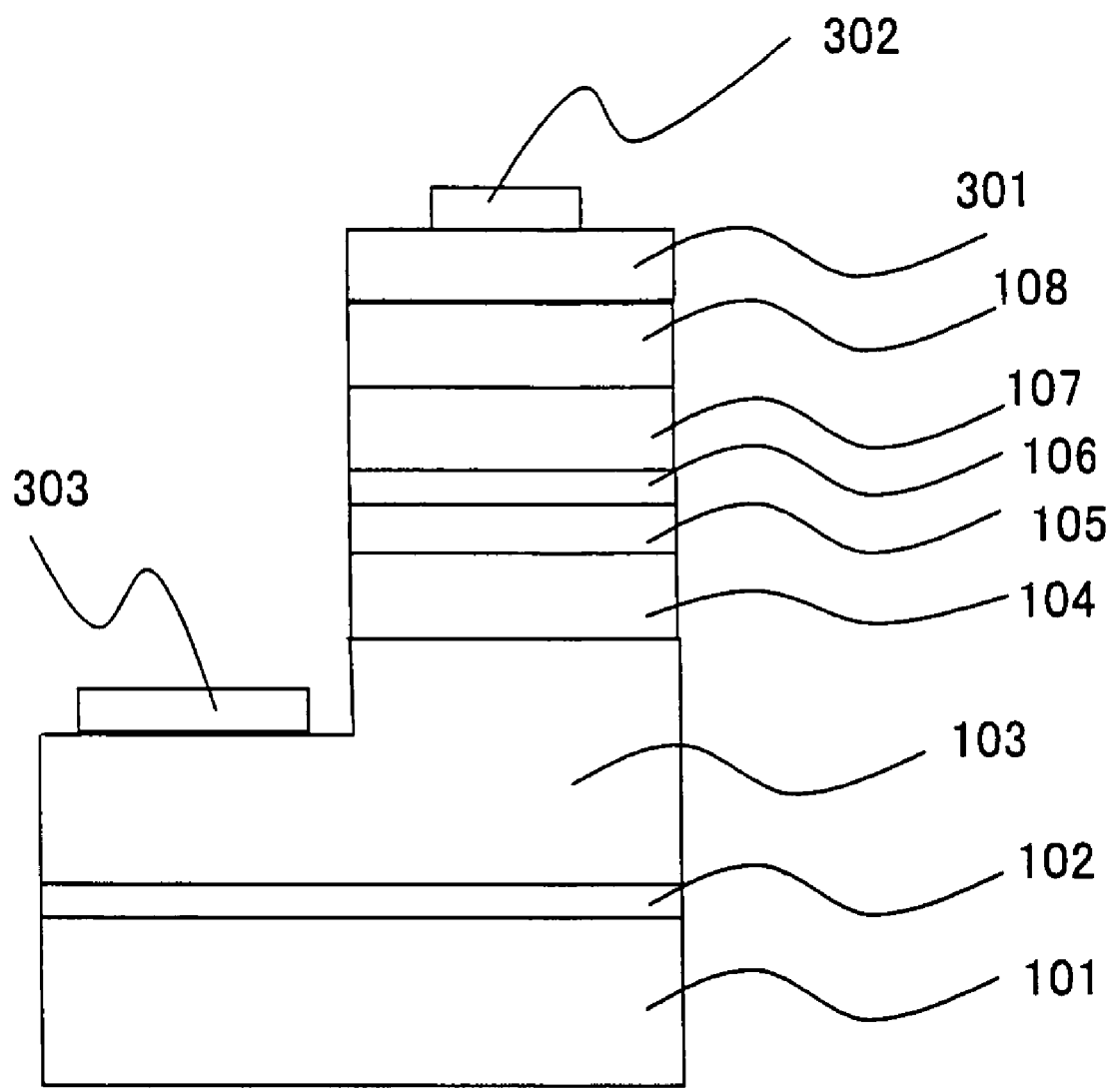
FIG. 4 is a schematic sectional view of a light-emitting diode formed by processing the multilayer semiconductor structure of FIG. 1.

FIG. 4 is a schematic sectional view showing a light-emitting diode formed by processing the multilayer semiconductor structure obtained in the aforementioned manner. The light-emitting diode shown in this figure can be formed as follows:

First, the wafer is taken out from the reaction furnace; a mask layer (not shown) patterned into a prescribed shape is formed on p-type contact layer 108; etching is carried out from the side of p-type contact layer 108 in a RIE (reactive ion etching) apparatus, and then a partial surface of a contact layer included in n-type nitride semiconductor layer 103 is exposed.

The mask layer is removed after the etching; a transparent electrode 301 of 7 nm thickness containing Pd is formed substantially on the overall surface of p-type contact layer 108; and then a p-side pad electrode 302 of Au is formed to have a thickness of 0.5 μm on a prescribed region of transparent electrode 301. On the other hand, an n-side pad electrode 303 containing Ti and Al is formed on the surface exposed by etching the n-type contact layer.

The light-emitting diode according to the present invention can be produced in the aforementioned manner. An average total luminous flux output of 30 light-emitting diodes produced according to this embodiment was 22.5 mW (wavelength: 455 nm) at an injection current of 20 mA.

On the other hand, an average total luminous flux output of comparative light-emitting diodes produced with using no surfactant during formation of the multilayer film structures was 18.9 mW (wavelength: 455 nm) at an injection current of 20 mA.

Regarding the light-emitting diode according to this embodiment and the comparative light-emitting diode produced with using no surfactant, their multilayer film structures were observed with a TEM (transmission electron microscope). As a result, it was confirmed that definiteness of the layer interfaces of the multilayer film structures in the light-emitting diode according to this embodiment was higher than that of the comparative light-emitting diode produced with using no surfactant.

As clearly understood from the above, even in the case of multilayer crystal growth usually causing loose layer interfaces, it becomes possible by using the surfactant to reduce the surface energy of the crystal growth surface and definitely form the layer interface in the multilayer film structure. In other words, by using the surfactant, flatness and definiteness can be ensured for the active layer formed in proximity to the n-type or p-type layer including the multilayer film structure or for the active layer having its multilayer film structure. Consequently, it is considered that irregularity in the internal quantum efficiency of the active layer is remedied, whereby causing improvement in the quantum efficiency of the active layer and enhancement in the total luminous flux output.

While each multilayer film structure includes two types of layers in the aforementioned embodiment, the present invention is also applicable to a multilayer film structure including at least three types of layers, as a matter of course.

As to formation of the electrodes, Pd, Ni, ITO, n-type GaN, or the like can be selected for a current diffusion layer and for an electrode on a p-type nitride semiconductor. Further, Au, Ti/Al, or the like can be selected for the pad electrodes.

Alternatively to the aforementioned embodiment, p-type contact layer 108 may be bonded to a separately prepared conductive support substrate so that an electrode provided on the side of n-type nitride semiconductor layer 103 serves as a light extraction electrode while a metal layer of Al, Pt, Ag, or the like having high reflectance is formed on the support substrate on the side of p-type contact layer 108, whereby providing a vertical electrode structure.

According to the inventive method of producing a nitride semiconductor light-emitting device, as hereinabove described, it is possible to improve the light-emitting efficiency of a nitride semiconductor light-emitting device such as a nitride semiconductor light-emitting diode for emitting blue light.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of producing a nitride semiconductor light-emitting device including a nitride semiconductor active layer between an n-type nitride semiconductor layer and a p-type nitride semiconductor layer on a substrate, wherein at least one of said n-type nitride semiconductor layer, said nitride semiconductor active layer and said p-type nitride semiconductor layer includes a multilayer film structure, the method comprising:

supplying a surfactant material to a crystal growth surface before or after crystal growth of a layer included in said multilayer film structure, said surfactant material being supplied in between growth steps of adjacent layers of said multilayer film structure when growth is not taking place, wherein said surfactant material contains at least one of In, Al, Ga, Mg, Zn, Si, Ge, and O.

2. The method of producing a nitride semiconductor light-emitting device according to claim 1, wherein
said multilayer film structure includes at least two types of layers having different band gaps.

3. The method of producing a nitride semiconductor light-emitting device according to claim 2, wherein
said surfactant material is supplied to a crystal growth surface before growing a layer having a larger band gap than another layer just under that layer.

4. The method of producing a nitride semiconductor light-emitting device according to claim 1, wherein
said multilayer film structure includes at least two types of layers having different carrier concentrations.

5. The method of producing a nitride semiconductor light-emitting device according to claim 4, wherein
said surfactant material is supplied to a crystal growth surface before growing a layer having a smaller carrier concentration than another layer just under that layer.

6. The method of producing a nitride semiconductor light-emitting device according to claim 1, wherein
supply of a source material containing a group III element is stopped when an element other than group III elements is supplied as said surfactant material.

7. The method of producing a nitride semiconductor light-emitting device according to claim 1, wherein
supply of a source material containing nitrogen is stopped when a group III element is supplied as said surfactant material.

8. The method of producing a nitride semiconductor light-emitting device according to claim 1, wherein
said crystal growth is metal organic vapor phase growth.

9. The method of claim 1, wherein the surfactant material facilitates a two-dimensional crystal growth mode.

10. The method of claim 1, wherein the surfactant material has a lower surface energy than that of GaN.

11. The method of claim 1, wherein the surfactant material has a surface energy lower than about 2.0 J/m$^2$.

12. The method of claim 1, wherein the surfactant material includes a group III element.

13. The method of claim 1, wherein the surfactant material includes an n-type impurity element.

14. The method of claim 1, wherein the surfactant material includes a p-type impurity element.

15. The method of claim 1, wherein the surfactant material is supplied for a duration of about 15 seconds.

16. The method of claim 1, wherein the nitride semiconductor active layer includes well layers formed of $In_aGa_{1-a}N$ (0<a<1) and barrier layers formed of $Al_bIn_cGa_{1-b-c}N$ (0≦b≦1, 0≦c≦1).

17. The method of claim 1, wherein the n-type nitride semiconductor layer includes alternately stacked n-type $Al_{0.2}Ga_{0.8}N$ layers and undoped GaN layers.

18. The method of claim 1, wherein the p-type nitride semiconductor layer includes alternately stacked p-type $Al_{0.2}Ga_{0.8}N$ layers and undoped GaN layers.

19. The method of claim 1, wherein the substrate is formed of sapphire, silicon carbide, silicon, or zinc oxide.

* * * * *